United States Patent
Zhan et al.

(10) Patent No.: US 11,122,259 B2
(45) Date of Patent: Sep. 14, 2021

(54) IMAGE SENSOR WITH VOLTAGE BUFFER FOR SELF-TEST

(71) Applicant: OmniVision Technologies, Inc., Santa Clara, CA (US)

(72) Inventors: Zhiyong Zhan, Fremont, CA (US); Tongtong Yu, Fremont, CA (US); Xin Wang, Cupertino, CA (US); Liang Zuo, San Mateo, CA (US); Kenny Geng, Mountain View, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/793,345

(22) Filed: Feb. 18, 2020

(65) Prior Publication Data
US 2021/0258563 A1 Aug. 19, 2021

(51) Int. Cl.
*G01R 31/56* (2020.01)
*H04N 5/378* (2011.01)
*H04N 17/00* (2006.01)

(52) U.S. Cl.
CPC ........... *H04N 17/002* (2013.01); *G01R 31/56* (2020.01); *H04N 5/378* (2013.01)

(58) Field of Classification Search
CPC ........ H04N 5/374; H04N 5/378; H04N 5/347; H04N 5/3745; H01L 27/14609; G01J 1/46
See application file for complete search history.

(56) References Cited

U.S. PATENT DOCUMENTS

| 8,223,048 | B2 * | 7/2012 | Wilhite | H03M 1/109 341/120 |
|---|---|---|---|---|
| 8,421,437 | B2 * | 4/2013 | Levine | G01N 27/4143 324/71.5 |
| 2003/0063019 | A1 * | 4/2003 | Bulaga | H03M 1/108 341/120 |
| 2004/0135992 | A1 * | 7/2004 | Munro | G01S 17/10 356/4.01 |
| 2016/0014363 | A1 * | 1/2016 | Kito | H04N 5/374 348/308 |

* cited by examiner

*Primary Examiner* — Paulos M Natnael

(57) ABSTRACT

A test voltage sample and hold circuitry is disclosed in a readout circuitry of an image sensor. This circuitry samples a voltage at demand value based on a ramp voltage shared by the ADC comparators of the readout circuitry. The value of the sampled voltage is controlled by a control circuitry which is able to predict and calculate at what time a ramp generator may carry the demand voltage value. The sampled voltage is held by a hold capacitor during readout of one row and is accessed during the next row by the control circuitry as test data to drive a device under test (DUT) which may be any portion of the image sensor to be tested. Measured data out of the DUT is compared with expected data. Based on the result of the comparison, a signal indicates the pass or fail of the self-test concludes a self-test of the DUT.

26 Claims, 6 Drawing Sheets

IMAGE SENSOR WITH VOLTAGE BUFFER FOR SELF-TEST

TECHNICAL FIELD

This disclosure relates generally to image sensors, and in particular but not exclusively, relates to test voltage sample and hold circuitry for use in self-testing an image sensor.

BACKGROUND INFORMATION

Image sensors have become ubiquitous. They are widely used in digital still cameras, cellular phones, security cameras, as well as, medical, automobile, and other applications. Image sensors commonly utilize Complementary-Metal-Oxide-Semiconductor (CMOS) image sensors to capture image data of an imaged scene. CMOS devices include an array of pixels which are photosensitive to incident light from a scene for a particular amount of time. This exposure time allows charges of individual pixels to accumulate until the pixels have a particular signal voltage value, also known as the pixel grey value. These individual signal voltage values may then be correlated into digital image data representing the imaged scene.

Image quality is very important for an image sensor. To achieve higher quality, the increase of the number of pixels within the array provides one solution. To make sure such an image sensor work properly to match the more and more challenging design requirements, test and debug capabilities provided to an image sensor are the essence to ensure its quality. Test of mage sensors can be carried out externally and internally. For internal tests, the current image sensor only has very limited analog test modes built-in by default. Development of the some of the needed test capabilities, including some of the important self-tests becomes critical for debug purposes.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
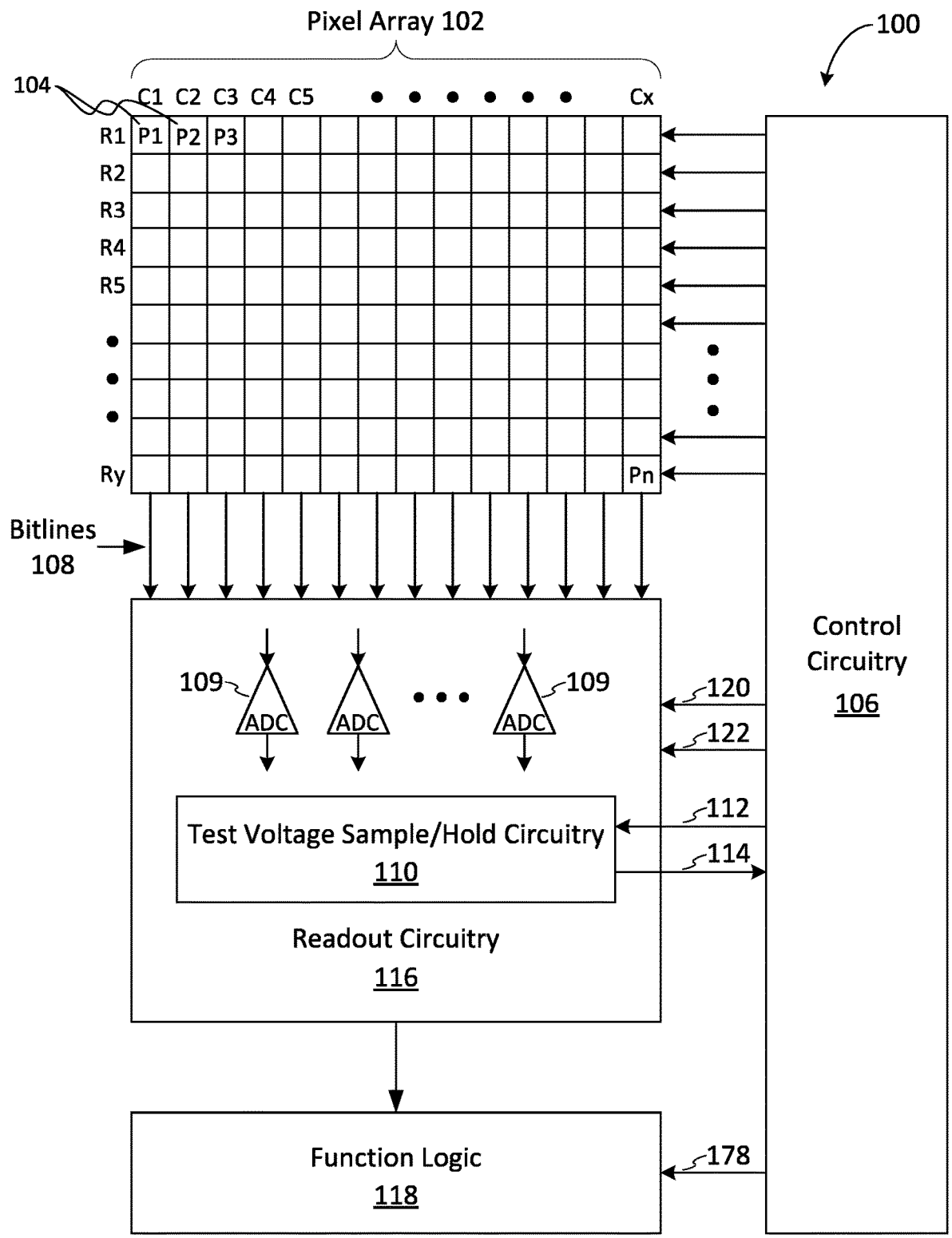
FIG. 1 illustrates one example of an imaging system in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples directed to test voltage sample and hold circuitry with self-test control is described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise.

FIG. 1 illustrates one example of an imaging system 100 in accordance with an embodiment of the present disclosure. Imaging system 100 includes pixel array 102, control circuitry 106, column arranged readout bitlines 108, readout circuitry 116, and function logic 118. In one example, pixel array 102 is a two-dimensional (2D) array of photodiodes, or image sensor pixel cells 104 (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 102 has acquired its image data or image charge, the image data is readout by readout circuitry 116 and then transferred to the function logic 118. The readout circuitry 116 may be coupled to read out image data from the plurality of photodiodes in pixel array 102 through bitlines 108. In various examples, the readout circuitry 116 may comprise amplification circuitry and column ADC circuitry 109. As will be described in greater detail below, the readout circuitry 116 may also comprise test voltage sample and hold (S/H) circuitry 110. The test voltage S/H circuitry 110 may be controlled by S/H control signal(s) 112 from the control circuitry 106 to sample a test voltage with a predetermined value to be held in a voltage storage and to output the stored test voltage 114 to be used by either the readout circuitry 116 and/or the control circuitry 106. The control circuitry 106 may control the readout circuitry 116 with control signals 120, or test voltages 122 which may be introduced to various pixels, ADCs 109 for testing purposes. The control circuitry 106 may also provide expected data 178 to the function logic 118 for testing.

In one example, function logic 118 may simply store the image data or even manipulate the image data by applying post image effects (e.g., crop, rotate, remove red eye, adjust brightness, adjust contrast, or otherwise). In one example, readout circuitry 116 may readout a row of image data at a time along readout column lines (illustrated) or may readout the image data using a variety of other techniques (not illustrated), such as a serial readout or a full parallel readout of all pixels 104 simultaneously.

In one example, imaging system 100 may be included in a digital camera, cell phone, laptop computer, security system, automobile, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2A:
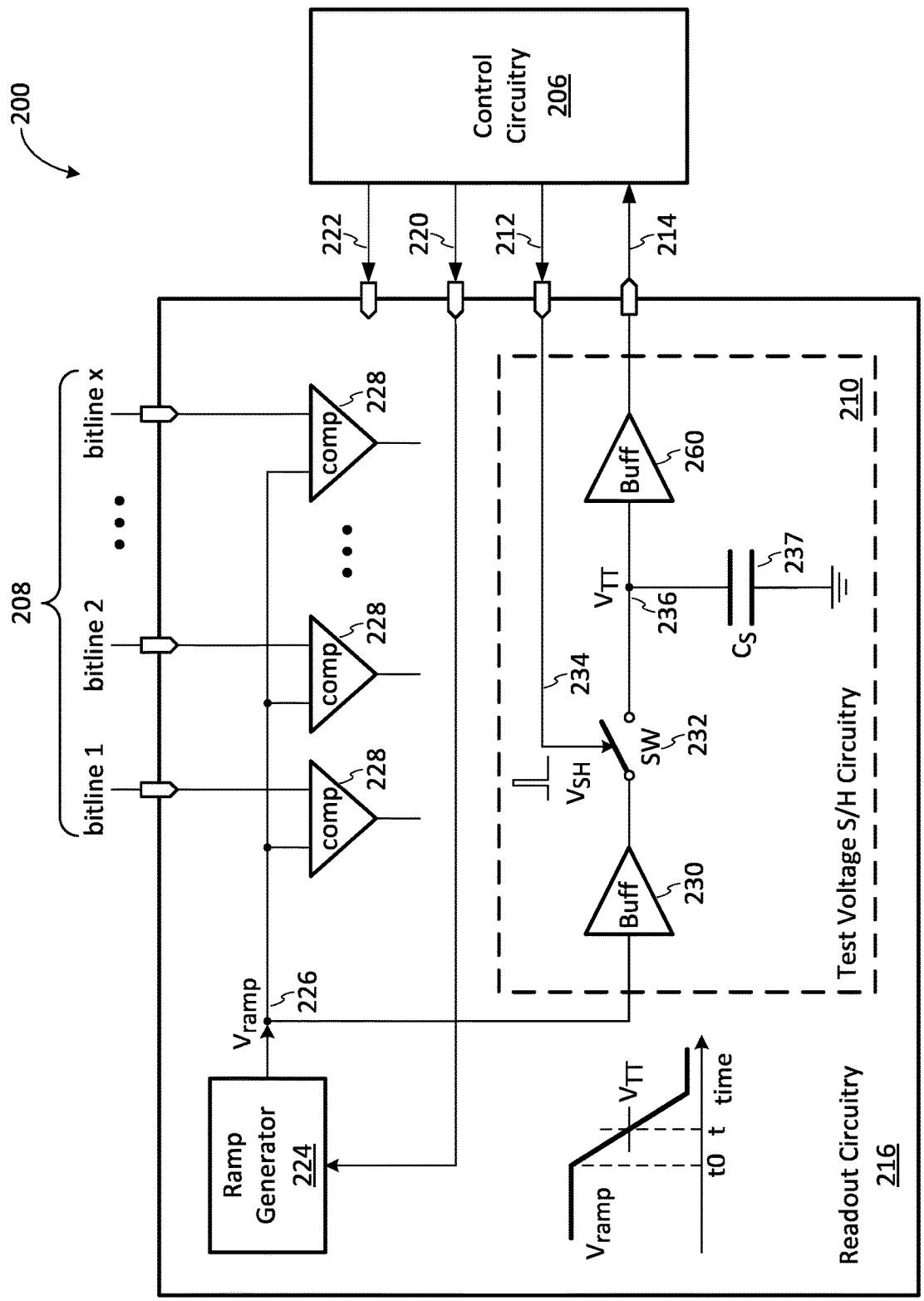
FIGS. 2A, 2B, and 2C illustrate schematic example of test voltage sample and hold circuitry, self-test circuitry, and example flow chart on how test voltages are buffered and used during a frame operation of testing in accordance with the teachings of the present disclosure.

FIG. 2A is a schematic example 200 that illustrates how a test voltage sample and hold (S/H) circuitry 210 functions in a readout circuitry 216. Inside the readout circuitry 216, a ramp generator 224 provides ramp voltage Vramp 226 to a plurality of ADC comparators 228 as well as an input buffer 230 of the test voltage S/H circuitry 210, where each ADC comparator 228 of the ADC 109 receives its other input from a respective bitline 208. Inside the test voltage S/H circuitry 210, the output of the input buffer 230 is coupled to one terminal of an S/H switch (SW) 232. The other terminal of the S/H SW 232 is coupled to a voltage hold capacitor $C_S$ 237 and also to an output buffer 260. A test voltage output 214 of the output buffer 260 is coupled to a control circuitry 206. The control circuitry 206 provides a SW control signal 212 to turn SW 232 on or off, a ramp control signal 220 to control the ramp generator 224, and a test voltage 222 to be injected to inputs of a device under test (DUT).

A plurality of column arranged readout bitlines 208 is introduced to the readout circuitry 216. Each column bitline i 208 (i=1, 2, ..., x, x is an integer) carries an analog image voltage signal that represent the brightness of a pixel in the current readout row j (j=1, 2, ..., y, y is an integer) which is illuminated by the incident light. The analog image voltage signal is converted to digital image signal by a column ADC 109 which is associated with each column bitline 208. The converted digital image signal is then transmitted to the function logic 118 for storage, comparison for test, or further processing as previously described.

The example column ADC implemented and used in the readout circuitry 216 may be a ramp ADC 109. Each ramp ADC 109 may comprise a comparator 228 that compares between the analog image voltage and a linear ramp signal Vramp 226 generated by a ramp generator 224. The ramp generator 224 may be shared by all column ADCs 109 or a portion of a plurality of column ADCs 109.

The ramp signal Vramp 226 may ramp upward or downward either configured or directly controlled by the control circuitry 206. The range of the ramp voltage is determined by the voltage range of the image signal between black and white introduced through the bitlines 208. For a ramp-down Vramp 226, since the ramp signal Vramp 226 is going to sweep through a very wide range of voltage from high to low each time it is used to convert the analog image signal to digital image signal, a pulse signal can be sent by the control circuitry 206 at the moment the predetermined voltage value is demanded to turn on switch SW 232 and allow the Vramp 226 value at the time t, VTT 236, to be sampled through the input buffer 230 and held (stored) in the hold capacitor $C_S$ 237 during a readout of a current row j. The voltage value VTT 236 stored in the hold capacitor $C_S$ 237 can be fed to the control circuitry 206 through the output buffer 260 during the next row j+1. The control circuitry 206 can decide to inject to any injecting inputs predesigned in the pixels 104, or the bitlines 208, or the ADCs 109 at certain time during the readout on row j+1.

The result of the entire frame through voltage injections can be viewed on a final output image and used to debug on what problem appeared at what place of the injections. This is possible because each row of the displayed frame may be set to a predefined value as in a known function. All of those row values in combined may form a certain frame pattern that may be easily examined even by human eyes.

As a self-test, such a testing mechanism of injecting voltage values can be built in to the pixel array 102 or anywhere in the readout circuitry 116. At any downstream data flow point from the pixel 104 to the bitline 108 or to the ADC 109, the injected voltage value can be compared with the expected values to evaluate on whether the circuit is doing what it was designed to do. If any discrepancy is observed which indicates problem surfaced, a warning can be sent to alarm such a problem.

The exact voltage value of $V_{TT}$ 236 is sampled by a sample and hold (S/H) signal $V_{SH}$ 234. $V_{SH}$ 234 is a short pulse signal 212 asserted by the control circuitry 206. Since the control circuitry 206 also controls the ramp generator 224, the starting time t0 of each Vramp 226 is controlled by a ramp enable signal 220 of the control circuitry 206. In an example where the Vramp 226 starts to roll down with a known constant linear rate, the exact voltage of Vramp 226 at a time t may be calculated based on how long (t-t0) the Vramp 226 has been ramping down from its initial voltage value since a starting time to. That is, if the enable signal 220 controls the ramp starting time t0 and the pulse S/H signal 212 controls the S/H time t of when the Vramp 226 is sampled, the voltage value of $V_{TT}$ 236 is set by both signals 220 and 212 of the same control circuitry 206.

Once the test voltage $V_{TT}$ 236 is sampled by the S/H signal $V_{SH}$ 234, $V_{TT}$ 236 is held in the hold capacitor $C_S$ 237. The hold capacitor $C_S$ 237 serves as a temporary voltage storage of the test voltage $V_{TT}$ 236. For a typical fast frame rate of 60-100 frames per second and a multiple thousands of rows per frame, the continuously held voltage value is accurate enough to be used (for testing) during the current row of readout when sampled and held during the immediate previous row of readout.

Since the ramp signal Vramp 226 is mainly used to drive a plurality of ADC comparators 228 of the ADCs, the accuracy of Vramp 226 is extremely critical to the performance of the ADCs. To minimize the interference to Vramp 226 caused by switch SW 232 due to the activation of the S/H signal $V_{SH}$ 234 and the hold capacitor $C_S$ 237 (and other circuits that may also be connected to the SW 232) when SW 232 is on, the input buffer 230 may be used to isolate the test voltage S/H circuitry 210 from disturbing the integrity of Vramp 226. For the similar reason, the output buffer 260 may also be implemented to shield the test voltage S/H circuitry 210 from the control circuitry 206.

Figure 2B:
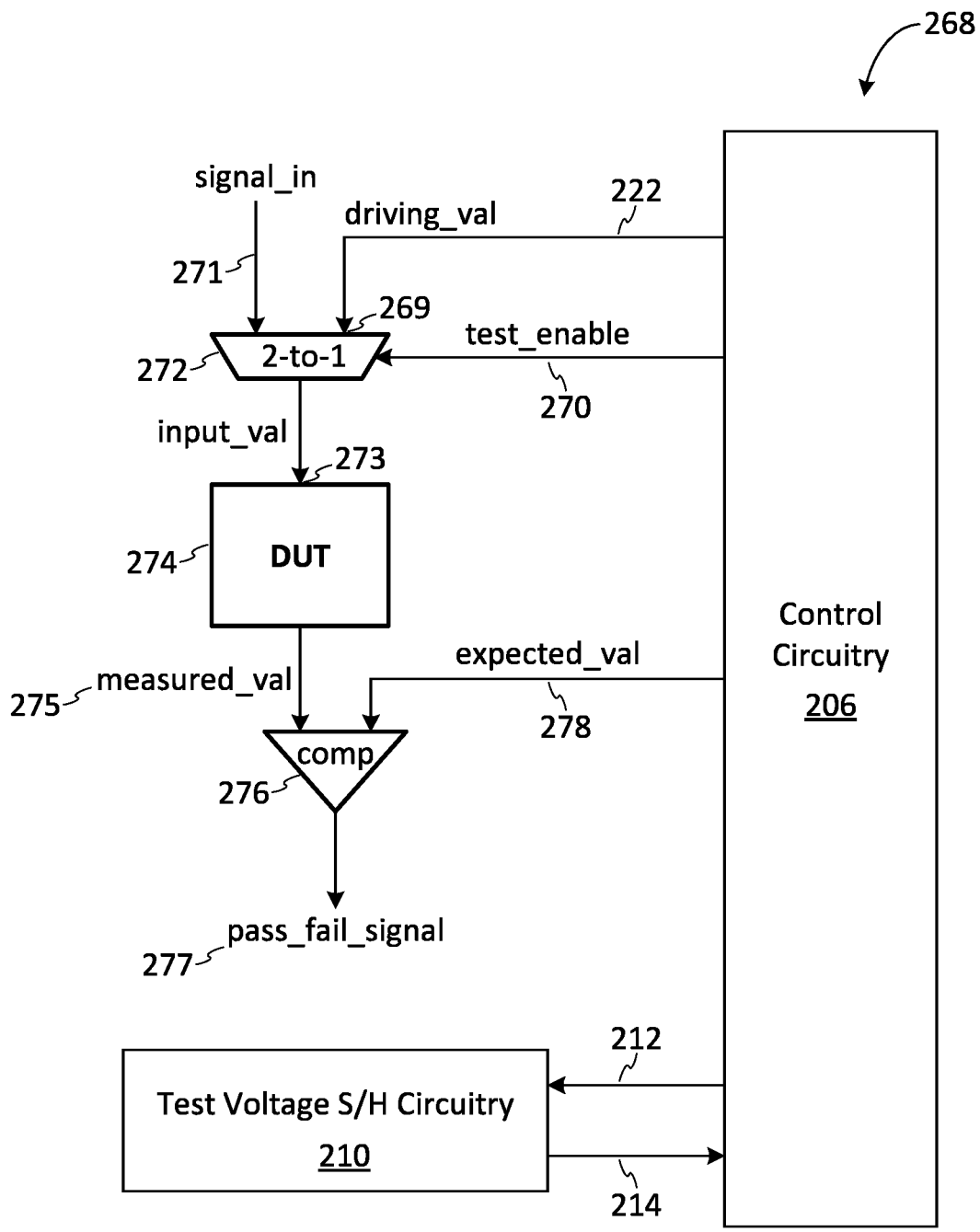

Both the input buffer 230 and output buffers 260 may be made of a source follower or an operational amplifiers with a unity gain. In the case of both buffers 230 and 260 made of the source follower, since the gain of the buffer is smaller than 1, the sampling time t should be readjusted by the S/H signal $V_{SH}$ 234 which may be controlled by the control circuitry 206 accordingly. Such timing modifications assures that once the test voltage $V_{TT}$ 236 sampled at time t is received by the control circuitry 206, it carries the needed driving voltage value 222 to be applied to a device under test (DUT) 274 in general as illustrated in FIG. 2B. The DUT may represent a portion of the pixel array 102, a portion of the readout circuitry 216, or any portion, standalone or combined, of the data circuit to be tested.

FIG. 2B illustrates a self-test circuitry 268 that may be configured to test the DUT 274. A 2-to-1 multiplexer 272 is introduced to an input 273 of the DUT 274 to select between a default signal input 271 and a test value 222 driven by the control circuitry 206. And a test comparator 276 is introduced to compare between an output of the DUT 274 and an expected value 278. The selection of the 2-to-1 mux 272 is controlled by a test enable signal 270 from the control circuitry 206. For normal operation, the signal input 271 is selected as a default input to the DUT 274 when the test enable signal 270 is set to low. The DUT 274 performs its designed function. For test operation, the driving value 222 is introduced to the DUT 274 through an injecting input 269 of the 2-to-1 mux 272 when the test enable signal 270 is set to high. The mux 272 may be replaced by two analog switches controlled by two inversely related signals, respectively. The expected value 278 may come from the control circuitry 206 or may be generated and provided locally within the DUT.

When each test value 222 is driven to the injecting input 269 to drive the DUT 274, the DUT 274 responds with a measured value 275. The measured value 275 is compared with the expected value 278 in the comparator 278. If the measured value 275 equals to the expected value 278, the pass/fail signal 277 indicates a pass, if otherwise, a fail. The test comparator 276 may be implemented to directly follow the DUT 274 physically at its output 275 or implemented in function logic 118. The comparison task of test comparator 276 may be accomplished with either hardware, software, or a combination of hardware and software, to determine whether the test at local level or global level is a success or not. As a result, a self-test is established when an autonomous mechanism is constructed in an image sensor 100, with a concluding signal 277 indicating the pass or fail of the self-test.

Figure 2C:
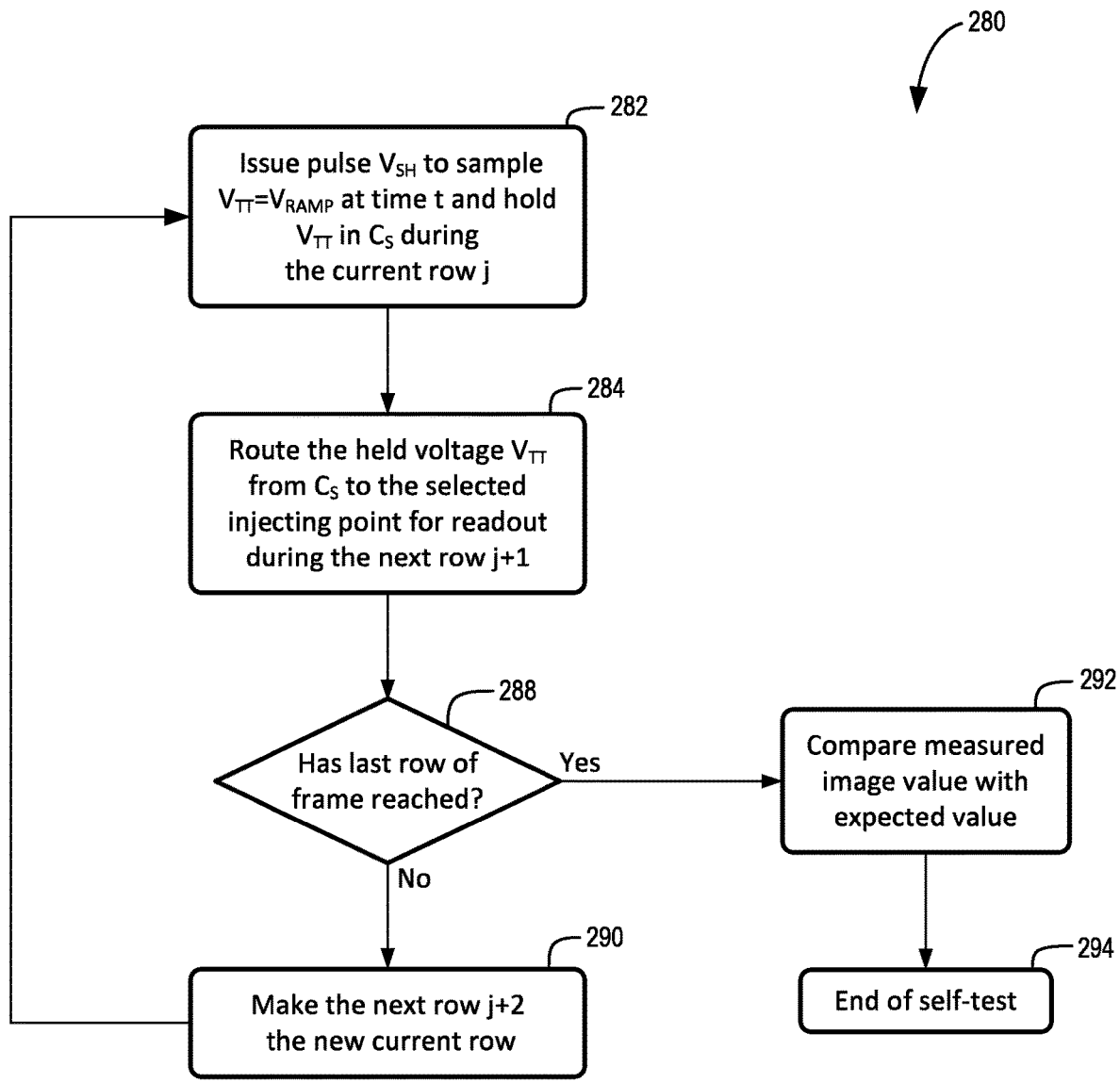

If a whole frame of an image sensor 100 is to be generated and tested using the S/H test voltages $V_{TT}$ 236 illustrated in FIG. 2A, a sequence illustrated in FIG. 2C is to be followed.

FIG. 2C is a flow chart 280 that illustrates a complete cycle of a frame readout of the image sensor under self-test in accordance with the embodiments of the present disclosure. The flow chart 280 begins at process block 282. Process block 282 marks the beginning of a frame readout cycle starting with a new current row j (j=1, 2, . . . , y, y is an integer). A plurality of pixel cells in row j is being read out by the readout circuitry 216 through bitlines 208. During block 282, while Vramp 226 is ramping up or down for the ADC comparators 228, at time t, SW 232 is closed momentarily by a short pulse 234 from SW control signal 212. A test voltage $V_{TT}$ 236 is sampled at time t from Vramp 226 and held in a hold capacitor $C_S$ 237.

The process block 282 may be followed by process block 284. During block 284, sequentially, image data of a plurality of pixel cells of the next row j+1 is being read out by the readout circuitry 216 through bitlines 208. The test voltage $V_{TT}$ 236 which is sampled and held in the hold capacitor $C_S$ 237 during the readout of row j is accessed by the control circuitry 206 through an output buffer 260 and a test voltage output 214. The control circuitry 206 then routes the test voltage $V_{TT}$ to the pre-configured injection inputs 269 in the image sensor under self-test. The test data based on the test voltage $V_{TT}$ may later be compared with the expected data. Still in the readout period of row j+1, the data comparison may happen either within the local circuit block "on the fly" where the test data is injected to or happen down the signal flow stream until the function logic 118. Once the image data is stored in the function logic 118, the tested data may be compared with the expected data either concurrently or at a later time after the image data of the entire frame has been acquired.

The process block 284 may be followed by process block 288. During block 288, if the current row j+1 is determined not yet reaching the last row (that is, j+1=y) of the subject image frame, the process block 288 may be followed by process block 290. If the current row j+1 is determined to be the very last row (j+1=y) of the subject image frame, the process block 288 may be followed by process block 292.

In process block 290, the next row to be read out in block 282 is set to be row j+2 (serves as the new "current row" in block 282). It then loops back to process block 282 subsequently.

At the point the process block 292 has been reached, the "image data" of the entire frame based on the test data has been stored in the function logic 118. The stored data are the measured data come from the readout circuitry 216 driven by the injected test data from the control circuitry 206. It brings the needed test information. If there is any problem with the pixels 104, bitlines 108, or ADCs, etc, in the readout circuitry 216, the self-test may be able to catch it by comparing the measured data with the expected data. The self-test disclosed here may be achieved either by hardware only, or by combinatory use of hardware and software. The expected data may also be stored locally in the function logic 118 or generated by the control circuitry 206 "on the fly" based on what test data has been injected to the image sense 100 under test, and provided to the function logic 118.

The process block 292 may be followed by process block 294. During block 294, the self-test flow 280 for each frame as illustrated in FIG. 2C is concluded.

As may be observed in FIG. 2C, due to the limitation (of having only one hold capacitor) of the test voltage S/H circuitry 210 disclosed in FIG. 2A, the test voltage $V_{TT}$ 236 can be sampled and held during the readout of row j and injected to the injection input 269 during the readout of the next row j+1. Therefore the so-called image data of the entire frame only has every alternate rows injected with test data by the control circuitry 206. That means, only the interleaved rows of each frame are self-tested. To resolve this imperfection, the following embodiment is further disclosed.

Figure 3A:
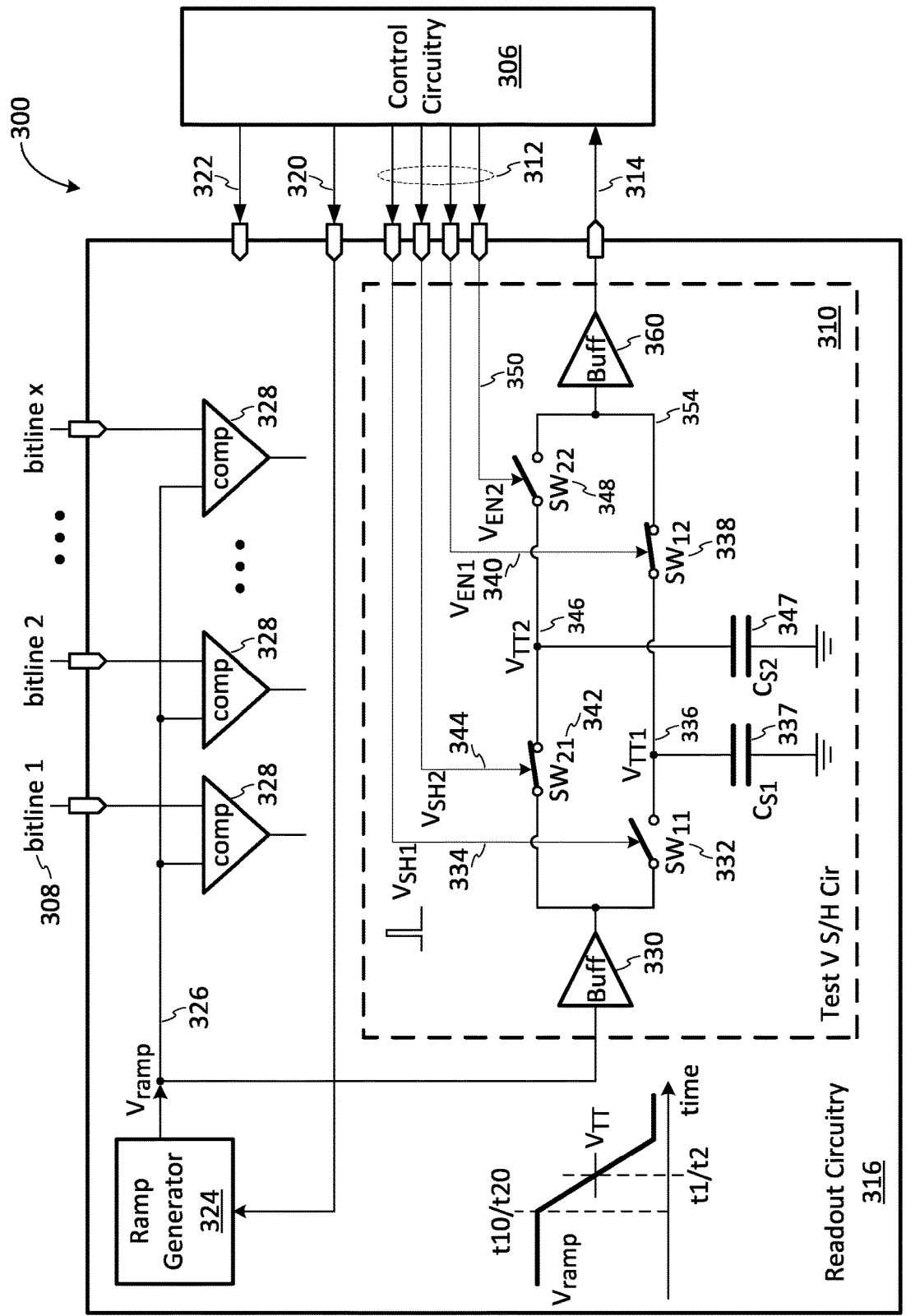
FIGS. 3A and 3B illustrate another schematic example of test voltage sample and hold circuitry and other example flow chart on how test voltages are buffered and used during a frame operation of testing in accordance with the teachings of the present disclosure.

FIG. 3A is another schematic example 300 that illustrates how a test voltage S/H circuitry 310 functions in a readout circuitry 316.

Inside the test voltage S/H circuitry 310, an input buffer 330 still receives its input from a ramp voltage Vramp 326 which is generated by a ramp generator 324 of the readout circuitry 316. The output of the input buffer 330 is coupled to two different hold capacitors $C_{S1}$ 337 and $C_{S2}$ 347 through S/H switches SW11 332 and SW21 342, respectively. Test voltages $V_{TT1}$ 336 and $V_{TT2}$ 346 can therefore be sampled and held in separate hold capacitors $C_{S1}$ 337 and $C_{S2}$ 347 during the readout periods of any two adjacent rows, alternately. This makes it possible to have the sample and use (more like write/read to memory) operations take place in parallel during the readout of the same row.

For example, when the test voltage $V_{TT2}$ 346 is sampled and held in hold capacitors $C_{S2}$ 347 and the previously held $V_{TT1}$ 336 in the hold capacitors $C_{S1}$ 337 can be provided to a control circuitry 306 for test purpose. As a result, each single readout row will continuously receive a single driving signal 322 from the control circuitry 306 which was sampled and held during the readout of the previous row. The self-test therefore has every single rows of the entire frame covered under test completely, in comparing to interleaved 50% coverage disclosed in FIGS. 2A and 2C.

The sampled test voltages $V_{TT1}$ 334 or $V_{TT2}$ 344 can be achieved under control of the sample and hold signals $V_{SH1}$ 334 and $V_{SH2}$ 344. $V_{SH1}$ 334 and $V_{SH2}$ 344 are pulse signals 212 asserted by the control circuitry 206. Since the control circuitry 306 also controls the ramp generator 324, the starting time t10/t20 of each Vramp 326 are controlled by a ramp enable signal 320 of the control circuitry 306.

In an example where the Vramp 326 starts to roll down with a known constant linear rate, the exact voltage of Vramp 326 at a time t1 may be calculated based on how long (t1-t10) the Vramp 326 has been ramping down from its initial voltage value at a starting time t10. That is, if the enable signal 320 controls the ramp starting time t10 and the pulse signal 312 controls the S/H time t1 of when the Vramp 326 is sampled, the voltage value of $V_{TT1}$ 336 is set by both signals 320 and 312 of the same control circuitry 306.

In similar way, when the Vramp 326 starts to roll down with a known constant linear rate, the exact voltage of Vramp 326 at a time t2 may be calculated based on how long (t2-t20) the Vramp 326 has been ramping down from its initial voltage value at a starting time t20. That is, if the enable signal 320 controls the ramp starting time t20 and the pulse signal 312 controls the S/H time t2 of when the Vramp 326 is sampled, the voltage value of $V_{TT2}$ 346 is set by both signals 320 and 312 of the same control circuitry 306.

Once the test voltage $V_{TT1}$ 334 or $V_{TT2}$ 344 are sampled by the S/H signal $V_{SH1}$ 334 or $V_{SH2}$ 344, $V_{TT1}$ 334 or $V_{TT2}$ 344 are held in hold capacitor $C_{S1}$ 337 or $C_{S2}$ 347. The hold capacitors $C_{S1}$ 337 and $C_{S2}$ 347 serve as the voltage storage of the test voltage $V_{TT1}$ 334 or $V_{TT2}$ 344, respectively.

As can be expected, to accommodate the added second hold capacitor $C_{S2}$ 347, selection switches SW12 338 and SW22 348 are also added to route only one of $V_{TT1}$ 336 or $V_{TT2}$ 346 to the input terminal 354 of an output buffer 360 at each time. SW12 338 or SW22 348 are set by VEN1 340 or VEN2 350 where each is one of the control signals 312 of the control circuitry 306. The selected test voltage $V_{TT1}$ 336 or $V_{TT2}$ 346 is accessed by the control circuitry 306 through an output buffer 360 at a test voltage output 314.

The control circuitry 306 then applies the test voltage $V_{TT1}$ 336 or $V_{TT2}$ 346 to drive a DUT 274 in an image sensor 100 under a self-test configuration. A test value 322 from a control circuitry 306 enabled by the test voltage $V_{TT1}$ 336 or $V_{TT2}$ 346 may be compared with an expected value 278. Still in the readout period of each row, the data comparison may happen either within the local circuit block "on the fly" where the test value 222 is just freshly injected to the DUT 274 or takes effects somewhere down the signal flow stream until the measured value 275 arrives at the function logic 118. Once the image test data is stored in the function logic 118, the measured value 275 from the DUT 274 driven by the test value 322 may be compared with the expected value 278 either concurrently or at a later time after the image test data of the entire frame has been acquired.

The same as in FIG. 2A, since the ramp signal Vramp 326 in FIG. 3A is mainly used to drive a plurality of ADC comparators 328, the accuracy of Vramp 326 is extremely critical to the performance of the ADCs 109. To minimize the interference to Vramp 326 caused by switches SW11 332 and SW21 342 due to the activation of the S/H signals $V_{SH1}$ 334 and $V_{SH2}$ 344 and the hold capacitors $C_{S1}$ 337 and $C_{S2}$ 347, and other circuits that may also be connected to the SW11 332 and SW21 342, when SW11 332 and SW21 342 are closed, the input buffer 330 may be used to isolate the test voltage S/H circuitry 310 from disturbing the integrity of Vramp 326. For similar reason, the output buffer 360 may also be implemented to shield the test voltage S/H circuitry 310 from the control circuitry 306.

Both the input buffer 330 and output buffers 360 may be made of a source follower or an operational amplifiers with a unity gain. In the case of both buffers 330 and 360 made of the source follower, since the gain of the buffer is smaller than 1, the sampling time t1/t2 may need to be readjusted by the S/H signal $V_{SH1}$ 334 and $V_{SH2}$ 344 which may be controlled by the control circuitry 306 accordingly. Such timing modifications assures that once the test voltage $V_{TT1}$ 336 or $V_{TT2}$ 346 sampled at time t1/t2 are received by the control circuitry 306, it carries the needed value of voltage to drive the DUT 274. The self-test circuit 268 of FIG. 2B may be implemented in the pixel array 102, or the bitline 208, or the readout circuitry 316 where the control circuitry 306 may be able to drive.

The same FIG. 2B illustrates a self-test circuit 268 that may be configured for the DUT 274. A 2-to-1 multiplexer 272 is introduced to an input 273 of the DUT 274 to select between a default signal input 271 and a test value 222/322 driven by the control circuitry 206/306. And a test comparator 276 is introduced to compare between an output of the DUT 274 and an expected value 278. The selection of the 2-to-1 mux 272 is controlled by a test enable signal 270 from the control circuitry 206/306. For normal operation, the signal input 271 is selected as a default input to the DUT 274 when the test enable signal 270 is set to low. For test operation, the test value 222/322 is driven to the DUT 274 through the 2-to-1 mux 272 when the test enable signal 270 is set to high. The mux 272 may be replaced with two analog switches controlled by two inversely related signals. The expected value 278 may come from the control circuitry 206/306 or may be provided locally within the DUT.

For each test value 222/322 introduced to the DUT 274, the DUT 274 responds with a measured value 275. The measured value 275 is compared with the expected value 278 in the comparator 276. If the measured value 275 equals to the expected value 278, the pass/fail signal 277 indicates a pass, if otherwise, a fail. The test comparator 276 may be implemented to directly follow the DUT 274 physically at its output 275 or implemented in function logic 118 (to display an entire frame of the image sensor 100, for instance). The comparing task of test comparator 276 may be accomplished with either hardware, software, or a combination of hardware and software, to determine whether the test at local level or global level is a success or not. As a result, a self-test is established when an autonomous mechanism is constructed in an image sensor 100, with a concluding signal 277 indicating the pass or fail of the self-test process.

Figure 3B:
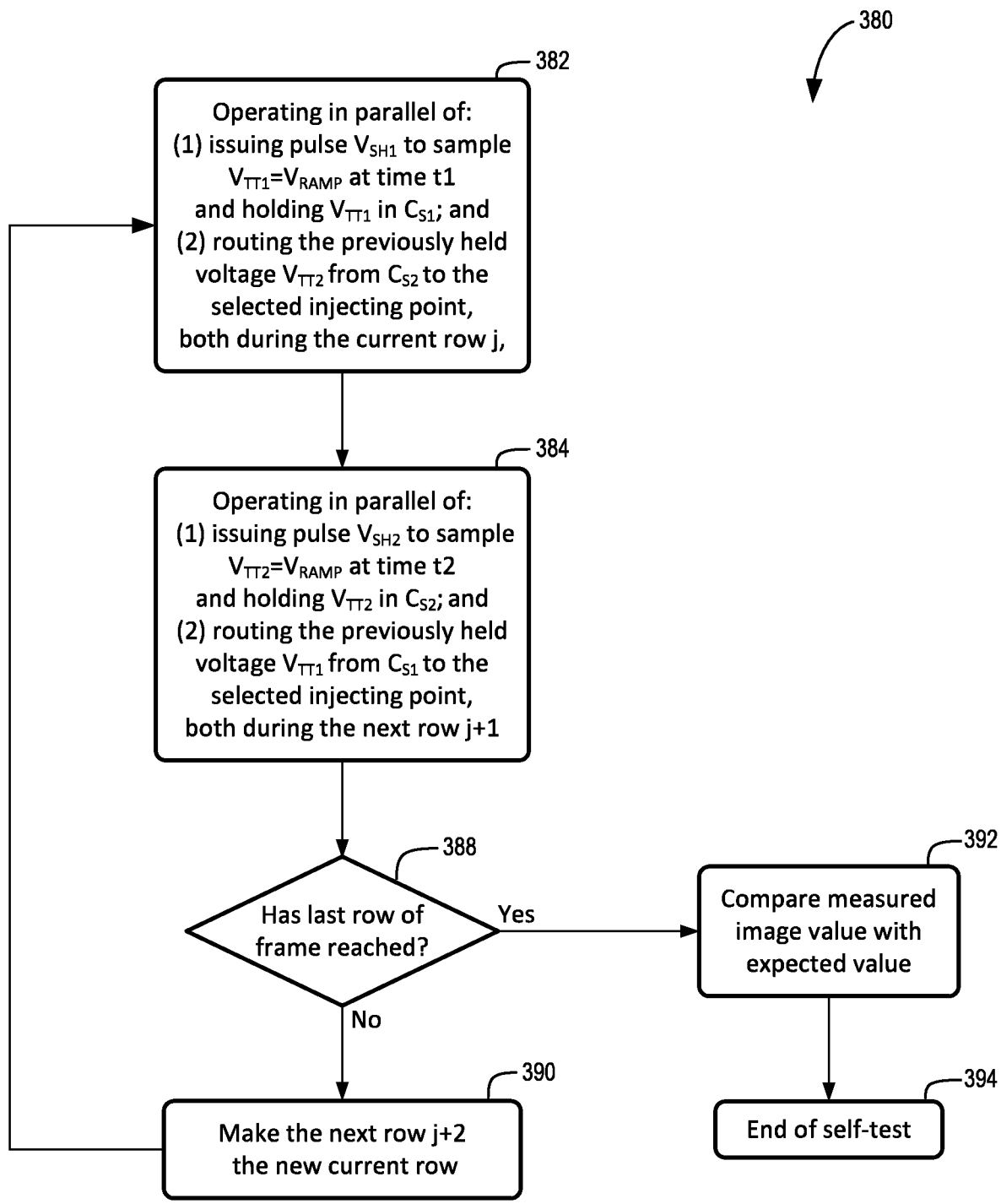

If a whole frame of an image sensor 100 is to be generated and tested using the S/H test voltages out of $V_{TT1}$ 336 or $V_{TT2}$ 346 as illustrated in FIG. 3A, a sequence illustrated in FIG. 3B is to be followed.

FIG. 3B is a flow chart 380 that illustrates a complete cycle of a frame readout of the image sensor under self-test in accordance with all the embodiments of the present disclosure. The flow chart 380 begins at process block 382. Process block 382 marks the beginning of a frame readout cycle starting with a new current row j (j=1, 2, . . . , y, y is an integer). A plurality of pixel cells in row j is being read out by the readout circuitry 316. During block 382, while Vramp 326 is ramping up or down for the ADC comparators 328, at time t1, SW11 332 is closed momentarily by a short pulse 334 from SW control signal 312. A test voltage $V_{TT1}$ 336 is sampled at time t1 from Vramp 326 and held in a hold capacitor $C_{S1}$ 337. During the same period of row j readout, operating in parallel, the previously held voltage $V_{TT2}$ 346 from $C_{S2}$ is fed to the control circuitry 306 and is selected to drive the injecting input(s) implemented in the image sensor 100.

The test data based on the test voltage $V_{TT1}$ 336 or $V_{TT2}$ 346 may be compared with the expected data. Still in the readout period of row j, the data comparison may happen either within the local circuit block "on the fly" where the test data is injected to or happen down the signal flow stream until the function logic 118. Once the image data is stored in the function logic 118, the measured data may be compared with the expected data either concurrently or at a later time after the image data of the entire frame has been acquired.

The process block 382 may be followed by process block 384. During block 384, sequentially, image data of a plurality of pixel cells of the next row j+1 is being read out by the readout circuitry 316. While Vramp 326 is ramping up or down for the ADC comparators 328, at time t2, SW11 332 is closed momentarily by a short pulse 344 from SW control signal 312. A test voltage $V_{TT2}$ 346 is sampled at time t2 from Vramp 326 and held in a hold capacitor $C_{S2}$ 347. During the same period of row j+1 readout, operating in parallel, the previously held voltage $V_{TT1}$ 336 from $C_{S1}$ 337 during block 382 was fed to the control circuitry 306 and was selected to drive the injecting input(s) implemented in the image sensor 100.

The test data based on the test voltage $V_{TT1}$ 336 or $V_{TT2}$ 346 may be compared with the expected data. Still in the readout period of row j+1, the data comparison may happen either within the local circuit block "on the fly" where the test data is injected to or happen down the signal flow stream until the function logic 118. Once the image data is stored in the function logic 118, the tested data may be compared with the expected data either concurrently or at a later time after the image data of the entire frame has been acquired.

The process block 384 may be followed by process block 388. During block 388, if the current row j+1 is determined not yet reaching the last row (j+1=y) of the subject image frame, the process block 388 may be followed by process block 390. If the current row j+1 is determined to be the very last row (j+1=y) of the subject image frame, the process block 388 may be followed by process block 392.

In process block 390, the next row to be read out in block 382 is set to be row j+2 (serves as the new "current row" for block 382). It then loops back to process block 382 subsequently.

At the point the process block 392 has been reached, the image data of the entire frame as measured has been stored in the function logic 118. The stored data are the measured data come from the readout circuitry 316 driven by the injected data from the control circuitry 306. It brings all the needed test information. If there is any problem with the pixels 104, bitlines 108, or ADCs, or any circuit in the readout circuitry 316, the self-test may be able to catch it by comparing the measured data against the expected data. The self-test disclosed here may be achieved by hardware only, or by combinatory use of hardware and software. The expected data may also be stored in the function logic 118 or generated by the control circuitry 306 "on the fly" based on what test data has been driven to the image sense 100 under test.

The process block 392 may be followed by process block 394. During block 394, the self-test flow 380 as illustrated in FIG. 3B is concluded.

As may be observed in FIGS. 3A and 3B, the limitation of having only one hold capacitor of the test voltage S/H circuitry 210 disclosed in FIGS. 2A and 2B has been lifted. Hold capacitors $C_{S1}$ 337 and $C_{S2}$ 347 may take turns to hold the sampled voltages $V_{TT1}$ 336 and $V_{TT2}$ 346, and to provide a demanded test voltage to the control circuitry 306 in an alternate ping-ponged way during each single row readout. That is, during one row readout, when one capacitor $C_{S1}$ 337 is busy holding voltage the newly sampled voltage $V_{TT1}$ 336 from the ramp generator 324, the other capacitor $C_{S2}$ 347 is busy outputting pre-held voltage $V_{TT2}$ 346 to the control circuitry 306. Next, during the subsequent row readout, when one capacitor $C_{S2}$ 347 is busy updating its newly sampled voltage $V_{TT2}$ 346 from the ramp generator 324, its counterpart capacitor $C_{S1}$ 337 is busy providing its voltage $V_{TT1}$ 336 held during the immediate previous row readout to the control circuitry 306. Therefore the test data of the entire frame has every single row stand a chance to be driven with test data by the control circuitry 306.

With FIGS. 3A and 3B, the coverage of the self-test rows spread over the entire frame instead of only the interleaved rows as disclosed in FIGS. 2A and 2B. That means, 100% of the rows in a frame may be self-tested in accordance with the teachings of the present disclosure. That is an improvement from 50% of the earlier disclosure as shown in FIGS. 2A and 2B.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A voltage buffer for self-test in an image sensor, comprising:
   a ramp voltage supply line, wherein the ramp voltage supply line is driven by a ramp generator;
   a first sample and hold (SH) switch, wherein a first terminal of the first SH switch is coupled to the ramp voltage supply line, and wherein a second terminal of the first SH switch is coupled to a control circuitry;
   a first voltage hold capacitor coupled between the second terminal of the first SH switch and a circuit ground;
   an input buffer coupled between the ramp voltage supply line and the first terminal of the first SH switch; and
   an output buffer coupled between the second terminal of the first SH switch and the control circuitry, wherein the input buffer and the output buffer are source followers or operational amplifiers with unity gain.

2. The voltage buffer of claim 1, wherein the first SH switch is controlled by the control circuitry.

3. The voltage buffer of of claim 1, further comprising:
   a second sample and hold (SH) switch, wherein a first terminal of the second SH switch is coupled to the first terminal of the first SH switch, and wherein a second terminal of the second SH switch is coupled to the control circuitry;
a second voltage hold capacitor coupled between the second terminal of the second SH switch and the circuit ground;
a first selection switch, wherein a first terminal of the first selection switch is coupled to the second terminal of the first SH switch, and wherein a second terminal of the first selection switch is coupled to the control circuitry; and
a second selection switch, wherein a first terminal of the second selection switch is coupled to the second terminal of the second SH switch, and wherein a second terminal of the second selection switch is coupled to the control circuitry.

4. The voltage buffer of claim 3, wherein the first SH switch, the second SH switch, the first selection switch, and the second selection switch are controlled by the control circuitry.

5. The voltage buffer of of claim 3, further comprises an output buffer coupled between the second terminal of the first selection switch and the control circuitry, wherein the second terminal of the second selection switch connects to the second terminal of the first selection switch.

6. The voltage buffer of of claim 5, wherein the input buffer and the output buffer are source followers.

7. The voltage buffer of of claim 5, wherein the input buffer and the output buffer are operational amplifiers with unity gain.

8. A method of self-testing a device under test (DUT) in alternate rows, comprising:
driving a short voltage pulse to turn a sample and hold (SH) switch on and off to sample a test voltage with a demanded value provided by a ramp voltage supply line and holding the test voltage to a voltage hold capacitor during a readout period of a current row j, wherein j is an integer;
providing the test voltage from the voltage hold capacitor to a control circuitry during a readout period of a next row j+1;
injecting a driving voltage from the control circuitry to an injecting input of the DUT based on the test voltage;
if the row j+1 of the image frame has reached the last row of the subject image frame, comparing measured image values from the DUT with expected values and providing a concluding signal to indicate a pass or fail status to end the self-test; and
if the row j+1 is not the last row of a subject image frame, advancing a next row to be row j+2 and continuing to issue the short voltage pulse to turn the SH switch on and off to sample a test voltage.

9. The method of self-testing of claim 8, wherein comparing the measured image values from the DUT with expected values takes place in a function logic.

10. The method of self-testing of claim 8, wherein the short voltage pulse to turn the SH switch on and off is generated by the control circuitry when the ramp voltage supply line reaches the demanded voltage value to be sampled and held as the test voltage.

11. The method of self-testing of claim 8, wherein the control circuitry issues a test enable signal to allow the driving voltage to be injected to the injecting input of the DUT through a 2-to-1 mux.

12. A method of self-testing a device under test (DUT) in all rows, comprising:

issuing a first short voltage pulse to turn a first sample and hold (SH) switch on and off to sample a first test voltage with a demanded value provided by a ramp voltage supply line and holding the first test voltage to a first voltage hold capacitor during a readout period of a current row j, wherein j is an integer;
providing a second test voltage from a second voltage hold capacitor to a control circuitry;
injecting a first driving voltage from the control circuitry to an injecting input of the DUT based on the second test voltage;
advancing the readout period from the row j to a row j+1;
issuing a second short voltage pulse to turn a second SH switch on and off to sample a second test voltage with a demanded value provided by a ramp voltage supply line and holding the second test voltage to a second voltage hold capacitor;
providing a first test voltage from a first voltage hold capacitor to the control circuitry; and
injecting a second driving voltage from the control circuitry to the injecting input of the DUT based on the first test voltage.

13. The method of self-testing of claim 12, further comprising:
determining whether the row j+1 is the last row of a subject image frame;
if the row j+1 of the image frame has reached the last row of the subject image frame, comparing measured image values from the DUT with expected values and providing a concluding signal to indicate a pass or fail status to end the self-test; and
if the row j+1 of the image frame is not the last row of a subject image frame, advancing a next row to be row j+2 and continuing to issue the first short voltage pulse to turn the first SH switch on and off to sample a first test voltage.

14. The method of self-testing all rows of claim 13, wherein comparing the measured image values with expected values takes place in a function logic.

15. The method of self-testing all rows of claim 12, wherein the first short voltage pulse to turn the first SH switch on and off is generated by the control circuitry when the ramp voltage supply line reaches the demanded voltage value to be sampled and held as the first test voltage, and wherein the second short voltage pulse to turn the second SH switch on and off is generated by the control circuitry when the ramp voltage supply line reaches the demanded voltage value to be sampled and held as the second test voltage.

16. The method of self-testing all rows of claim 12, wherein the control circuitry issues a test enable signal to allow the driving voltage to be injected to the injecting input of the DUT through a 2-to-1 mux.

17. A self-test image sensing system, comprising:
a pixel array including a plurality of pixels;
a control circuitry coupled to the pixel array to control operation and test of the pixel array;
a readout circuitry controlled by the control circuitry and coupled to the pixel array through a plurality of bitlines to read out analog image data from the pixel array, wherein the readout circuitry comprises
a plurality of analog-to-digital converters (ADCs) to convert analog image data to digital image data,
a ramp generator to generate a ramp voltage on a ramp voltage supply line that drives the plurality of ADCs,
a test voltage sample and hold circuitry, wherein the test voltage sample and hold circuitry comprises a first sample and hold (SH) switch, wherein a first terminal of the first SH switch is coupled to the ramp voltage supply line, and wherein a second terminal of the first SH switch is coupled to the control circuitry;

a first voltage hold capacitor coupled between the second terminal of the first SH switch and a circuit ground; and an input buffer coupled between the ramp voltage supply line and the first terminal of the first SH switch; and a function logic coupled to receive digital image data from the readout circuitry and to receive expected data from the control circuitry.

18. The self-test image sensing system of claim 17, wherein the first SH switch is controlled by the control circuitry.

19. The self-test image sensing system of claim 17, further comprises an output buffer coupled between the second terminal of the first SH switch and the control circuitry.

20. The self-test image sensing system of claim 17, wherein the input buffer and the output buffer are source followers.

21. The self-test image sensing system of claim 17, wherein the input buffer and the output buffer are operational amplifiers with unity gain.

22. The self-test image sensing system of claim 17, further comprising:

a second sample and hold (SH) switch, wherein a first terminal of the second SH switch is coupled to the first terminal of the first SH switch, and wherein a second terminal of the second SH switch is coupled to the control circuitry;

a second voltage hold capacitor coupled between the second terminal of the second SH switch and the circuit ground;

a first selection switch, wherein a first terminal of the first selection switch is coupled to the second terminal of the first SH switch, and wherein a second terminal of the first selection switch is coupled to the control circuitry; and a second selection switch, wherein a first terminal of the second selection switch is coupled to the second terminal of the second SH switch, and wherein a second terminal of the second selection switch is coupled to the control circuitry.

23. The self-test image sensing system of claim 22, wherein the first SH switch, the second SH switch, the first selection switch, and the second selection switch are controlled by the control circuitry.

24. The self-test image sensing system of claim 22, further comprises an output buffer coupled between the second terminal of the first selection switch and the control circuitry, wherein the second terminal of the second selection switch connects to the second terminal of the first selection switch.

25. The self-test image sensing system of claim 24, wherein the input buffer and the output buffer are source followers.

26. The self-test image sensing system of claim 24, wherein the input buffer and the output buffer are operational amplifiers with unity gain.

* * * * *